United States Patent
Han et al.

(10) Patent No.: US 12,426,505 B2
(45) Date of Patent: Sep. 23, 2025

(54) FLEXIBLE ACOUSTIC-ELECTRIC SUBSTRATE AND PREPARATION METHOD THEREFOR, AND FLEXIBLE ACOUSTIC-ELECTRIC DEVICE

(71) Applicant: BOE TECHNOLOGY GROUP CO., LTD., Beijing (CN)

(72) Inventors: Yanling Han, Beijing (CN); Xue Dong, Beijing (CN); Haisheng Wang, Beijing (CN); Yingming Liu, Beijing (CN); Lijun Zhao, Beijing (CN); Yuzhen Guo, Beijing (CN); Peixiao Li, Beijing (CN); Yaqian Ji, Beijing (CN); Chenyang Zhang, Beijing (CN); Xiufeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1146 days.

(21) Appl. No.: 17/285,129

(22) PCT Filed: May 19, 2020

(86) PCT No.: PCT/CN2020/091039
§ 371 (c)(1),
(2) Date: Apr. 14, 2021

(87) PCT Pub. No.: WO2020/238696
PCT Pub. Date: Dec. 3, 2020

(65) Prior Publication Data
US 2022/0037585 A1 Feb. 3, 2022

(30) Foreign Application Priority Data
May 27, 2019 (CN) .......................... 201910447022.5

(51) Int. Cl.
*H10N 30/01* (2023.01)
*H10N 30/00* (2023.01)
(Continued)

(52) U.S. Cl.
CPC ........... *H10N 30/01* (2023.02); *H10N 30/706* (2024.05); *H10N 30/853* (2023.02); *H10N 30/8554* (2023.02); *H10N 30/857* (2023.02)

(58) Field of Classification Search
CPC .... H10N 30/01; H10N 30/706; H10N 30/853; H10N 30/8554; H10N 30/857;
(Continued)

(56) References Cited

U.S. PATENT DOCUMENTS

| 6,379,510 B1 | 4/2002 | Kane et al. |
| 7,525,399 B2 | 4/2009 | Yanase et al. |

(Continued)

FOREIGN PATENT DOCUMENTS

| CN | 1874147 A | 12/2006 |
| CN | 101385392 A | 3/2009 |

(Continued)

OTHER PUBLICATIONS

Second office action issued in Chinese Patent Application No. 201910447022.5 with search report.

*Primary Examiner* — Livius R. Cazan
(74) *Attorney, Agent, or Firm* — CHIWIN LAW LLC; Jie Sha

(57) ABSTRACT

Embodiments of the present disclosure provide a flexible acoustic-electric substrate and a preparation method thereof, and a flexible acoustic-electric device. The preparation method of a flexible acoustic-electric substrate includes: forming a flexible substrate; forming a plurality of piezoelectric components on the flexible substrate; and forming a plurality of chambers on the flexible substrate in a one-to-
(Continued)

one correspondence relationship with the plurality of piezoelectric components, and the plurality of chambers are located on a side of the flexible substrate away from the plurality of piezoelectric components.

13 Claims, 9 Drawing Sheets

(51) Int. Cl.
*H10N 30/853* (2023.01)
*H10N 30/857* (2023.01)

(58) Field of Classification Search
CPC ... B41J 2002/14491; B41J 2002/14459; Y10T 29/42
See application file for complete search history.

(56) References Cited

U.S. PATENT DOCUMENTS

| | | |
|---|---|---|
| 7,856,804 B2 | 12/2010 | Laming et al. |
| 10,770,646 B2 | 9/2020 | Kidwell, Jr. et al. |
| 2012/0306316 A1* | 12/2012 | Nakamura ........... H10N 30/072 29/25.35 |
| 2014/0132676 A1* | 5/2014 | Yazaki ................ B41J 2/14233 347/71 |

FOREIGN PATENT DOCUMENTS

| | | |
|---|---|---|
| CN | 102420582 A | 4/2012 |
| CN | 108701751 A | 10/2018 |
| CN | 109301061 A | 2/2019 |
| CN | 109387235 A | 2/2019 |
| CN | 110112284 A | 8/2019 |
| EP | 3333676 A1 | 6/2018 |
| JP | 2006326979 A * | 12/2006 |

* cited by examiner

FLEXIBLE ACOUSTIC-ELECTRIC SUBSTRATE AND PREPARATION METHOD THEREFOR, AND FLEXIBLE ACOUSTIC-ELECTRIC DEVICE

This application is a U.S. National Phase Entry of International Application No. PCT/CN2020/091039 filed on May 19, 2020, designating the United States of America and claiming priority to Chinese Patent Application No. 201910447022.5, filed on May 27, 2019. The present application claims priority to and the benefit of the above-identified applications and the above-identified applications are incorporated by reference herein in their entirety.

TECHNICAL FIELD

Embodiments of the present disclosure relate to a flexible acoustic-electric substrate and a preparation method thereof, and a flexible acoustic-electric device.

BACKGROUND

In recent years, piezoelectric transducers have gradually been applied to display devices, mainly serve as sound devices, and can also be used for fingerprint recognition and distance detection. The piezoelectric transducer is a device that uses piezoelectric effect and inverse piezoelectric effect for acoustic-to-electric and electric-to-acoustic conversion, and can not only convert electric energy into acoustic energy, but also can convert acoustic energy into electric energy.

SUMMARY

At least one embodiment of the present disclosure provides a preparation method of a flexible acoustic-electric substrate, the preparation method of a flexible acoustic-electric substrate comprises: forming a flexible substrate; forming a plurality of piezoelectric components on the flexible substrate; and forming a plurality of chambers on the flexible substrate in a one-to-one correspondence relationship with the plurality of piezoelectric components, and the plurality of chambers are located on a side of the flexible substrate away from the plurality of piezoelectric components.

For example, in the preparation method provided by an embodiment of the present disclosure, the forming the flexible substrate comprises: forming a first flexible layer on a carrier plate; forming a mask layer on the first flexible layer, wherein in a case where forming the plurality of chambers, the mask layer is used as a hard mask; and forming a second flexible layer, a barrier layer, and a third flexible layer sequentially on the mask layer, to form the flexible substrate, wherein the flexible substrate comprises the first flexible layer, the mask layer, the second flexible layer, the barrier layer and the third flexible layer.

For example, in the preparation method provided by an embodiment of the present disclosure, the forming the plurality of chambers on the flexible substrate in the one-to-one correspondence relationship with the plurality of piezoelectric components comprises: removing the carrier plate from the flexible substrate; and etching the first flexible layer, and by using the mask layer as the hard mask, continuing to etch a portion of the second flexible layer not blocked by the mask layer until the barrier layer is reached, to form the plurality of chambers on the flexible substrate in the one-to-one correspondence relationship with the plurality of piezoelectric components.

For example, in the preparation method provided by an embodiment of the present disclosure, the forming the flexible substrate comprises: providing a first flexible film, a barrier layer and a second flexible film; and bonding the first flexible film to the second flexible film through the barrier layer, to form the flexible substrate, wherein the barrier layer is provided between the first flexible film and the second flexible film, and the flexible substrate comprises the first flexible film, the barrier layer and the second flexible film.

For example, in the preparation method provided by an embodiment of the present disclosure, the forming the plurality of chambers on the flexible substrate in the one-to-one correspondence relationship with the plurality of piezoelectric components comprises: arranging a mask on a side of the first flexible film away from the barrier layer; and etching a portion of the first flexible film not blocked by the mask until the barrier layer is reached, to form the plurality of chambers in the one-to-one correspondence relationship with the plurality of piezoelectric components.

For example, in the preparation method provided by an embodiment of the present disclosure, the forming the flexible substrate comprises: forming a first flexible film on a carrier plate by a coating solidification forming film method; forming a barrier layer on the first flexible film by a depositing method; and forming a second flexible film on the barrier layer by the coating solidification forming film method, to form the flexible substrate, wherein the flexible substrate comprises the first flexible film, the barrier layer and the second flexible film.

For example, in the preparation method provided by an embodiment of the present disclosure, the forming the plurality of chambers on the flexible substrate in the one-to-one correspondence relationship with the plurality of piezoelectric components comprises: removing the carrier plate from the flexible substrate; arranging a mask on a side of the first flexible film away from the barrier layer; and etching a portion of the first flexible film not blocked by the mask until the barrier layer is reached, to form the plurality of chambers in the one-to-one correspondence relationship with the plurality of piezoelectric components.

For example, in the preparation method provided by an embodiment of the present disclosure, an operation of the etching uses an inductively coupled plasma etching process.

For example, in the preparation method provided by an embodiment of the present disclosure, a material of the barrier layer comprises silicon oxide or monocrystalline silicon.

For example, in the preparation method provided by an embodiment of the present disclosure, a material of the first flexible layer, the second flexible layer and the third flexible layer comprises polyimide.

For example, in the preparation method provided by an embodiment of the present disclosure, a material of the first flexible film and the second flexible film comprises polyimide.

For example, in the preparation method provided by an embodiment of the present disclosure, the forming the plurality of piezoelectric components on the flexible substrate comprises: forming the plurality of piezoelectric components on the flexible substrate, wherein each of the plurality of piezoelectric components comprises a first electrode, a piezoelectric layer and a second electrode arranged in sequence; or, forming the plurality of piezoelectric components on the flexible substrate, and each of the plurality of piezoelectric components comprises a first electrode, an insulating layer, a piezoelectric layer and a second electrode arranged in sequence.

For example, the preparation method provided by an embodiment of the present disclosure further comprises: while forming the first electrode on the flexible substrate, forming one or more first electrode pads and one or more second electrode pads respectively in a bonding region of the flexible substrate simultaneously, and the first electrode pad being connected to the first electrode; while forming the piezoelectric layer on the first electrode, forming a through hole in the piezoelectric layer to expose the one or more second electrode pads; while forming a plurality of block-shaped second electrodes on the piezoelectric layer, forming an electrode line simultaneously, wherein the plurality of the second electrodes are connected sequentially by the electrode line in a column or a row, and the electrode line is connected to the corresponding second electrode pad through the through hole; and/or, each of the plurality of second electrodes is connected to the corresponding second electrode pad through an individual electrode line and the through hole.

For example, the preparation method provided by an embodiment of the present disclosure further comprises: while forming a plurality of block-shaped first electrodes on the flexible substrate, forming an electrode line simultaneously, and forming one or more second electrode pads and one or more first electrode pads in a bonding region of the flexible substrate, wherein the plurality of the first electrodes are connected sequentially by the electrode line in a column or a row, and the electrode line is connected to the corresponding first electrode pad; and/or, each of the plurality of first electrode is connected to the corresponding first electrode pad through an individual electrode line; while forming the piezoelectric layer on the first electrode, forming a through hole on the piezoelectric layer to expose the one or more second electrode pads; and while forming the second electrode on the piezoelectric layer, connecting the second electrode to the second electrode pad through the through hole.

For example, in the preparation method provided by an embodiment of the present disclosure, areas of the second electrodes of at least two of the plurality of piezoelectric components are different; or, areas of the first electrodes of at least two of the plurality of piezoelectric components are different; or, ratios of the area of the second electrode to the area of the first electrode of at least two of the plurality of piezoelectric components are different; or, thicknesses of the piezoelectric layers of at least two of the plurality of piezoelectric components are different.

For example, in the preparation method provided by an embodiment of the present disclosure, in an identical piezoelectric component, a ratio of an area of the second electrode to an area of the first electrode is 0.7-0.8.

For example, in the preparation method provided by an embodiment of the present disclosure, a material of the piezoelectric layer comprises lead zirconate titanate piezoelectric ceramic composite crystal, zinc oxide or polyvinylidene fluoride.

For example, in the preparation method provided by an embodiment of the present disclosure, the plurality of piezoelectric components are arranged regularly.

For example, in the preparation method provided by an embodiment of the present disclosure, an orthographic projection of each of the plurality of piezoelectric components on the flexible substrate and an orthographic projection of the corresponding chamber on the flexible substrate at least partially overlap.

For example, in the preparation method provided by an embodiment of the present disclosure, a shape of the first electrode is a circle, a square, a pentagon or a hexagon; and/or a shape of the second electrode is a circle, a square, a pentagon or a hexagon.

For example, in the preparation method provided by an embodiment of the present disclosure, the carrier plate comprises a glass carrier plate.

At least one embodiment of the present disclosure further provides a flexible acoustic-electric substrate, and the flexible acoustic-electric substrate is prepared by the preparation method of the flexible acoustic-electric substrate according to any embodiment mentioned above.

At least one embodiment of the present disclosure further provides a flexible acoustic-electric device comprising the flexible acoustic-electric substrate according to any embodiment of the present disclosure.

BRIEF DESCRIPTION OF THE DRAWINGS

The accompanying drawings are used to provide a further understanding of the technical solution of the present disclosure, constitute a part of the specification, together with the embodiments of the present disclosure are used to explain the technical solution of the present disclosure, and do not constitute a limitation to the technical solution of the present disclosure. The shapes and sizes of the components in the drawings do not reflect the true proportions, and are only intended to illustrate the present disclosure.

DETAILED DESCRIPTION

Figure 1:
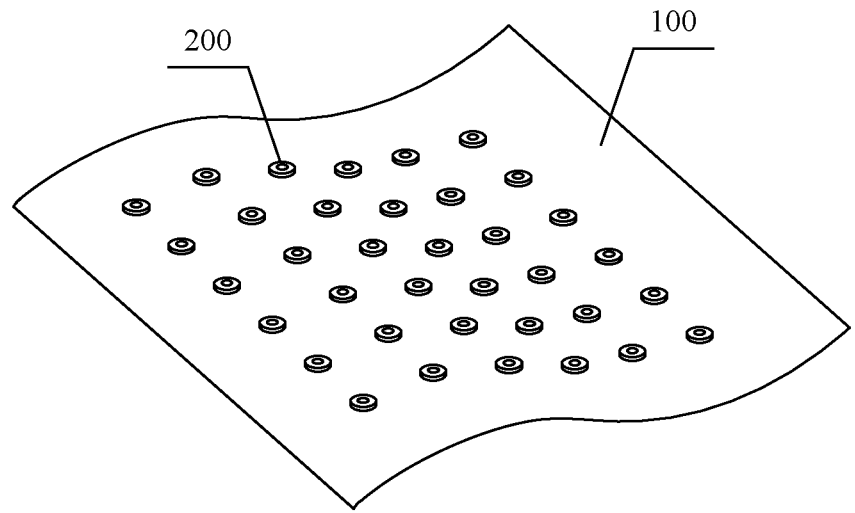
FIG. 1 is a structural schematic diagram of a flexible acoustic-electric substrate provided by embodiments of the present disclosure.

In order to make objects, technical details and advantages of the embodiments of the present disclosure clearer, the technical solutions of the embodiments of the present disclosure will be described clearly and completely in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

With the development of display devices in the direction of flexibility, ultra-thin, narrow bezel, and even full-screen design, etc., new challenges are presented to piezoelectric transducers. On one hand, due to the space for installing a transducer is getting smaller and smaller, the installation position of a traditional transducer with a larger volume is limited. On the other hand, due to the traditional transducer is usually a hard and opaque structure, it is difficult to be integrated with a flexible display device, which limits the potential applications of the transducer in implantable, wearable, non-invasive and other fields.

In order to realize the integration of a piezoelectric transducer and a flexible display device, a piezoelectric film sound device may be used. However, the inherent frequency of a piezoelectric film is far away from the audible audio frequency band, and has disadvantages such as low working efficiency, high driving voltage, high power consumption, and poor low-frequency characteristics. For example, a flexible piezoelectric transducer may also be used, and a sacrificial layer process may be used to prepare a chamber. However, since a sacrificial layer needs to be etched through a small etch hole, it is easy to cause problems of etching residue and nonuniformity, so that the yield is low. In addition, since the flexible piezoelectric transducer prepared by the sacrificial layer process requires subsequent sealing the etched hole and vacuuming of the chamber, the process is complicated to achieve, and the production cost is high, making it difficult to form mass production.

Therefore, how to overcome the disadvantages of the prior method such as low yield and complex process realization, and preparing a flexible, transparent and easy-to-integrate flexible piezoelectric transducer is a technical problem to be solved urgently in this field.

A technical problem to be solved by the embodiments of the present disclosure is to provide a flexible acoustic-electric substrate and a preparation method thereof, and a flexible acoustic-electric device, so as to overcome the disadvantages of the prior method such as low yield and complex process realization.

The embodiments of the present disclosure provide a flexible acoustic-electric substrate and a preparation method thereof, and a flexible acoustic-electric device, which have advantages such as simple process, simple structure, flexible layout, small size, easy integration, high yield by forming a piezoelectric transducer array on a flexible substrate and forming chamber by etching the flexible substrate, and effectively solves the disadvantages of the prior structure, such as large volume, difficult integration, being not capable of bending due to rigidity, limited application, low yield, complex process realization, etc. In the flexible acoustic-electric substrate and the preparation method thereof, and the flexible acoustic-electric device provided by at least some embodiments, a chamber is formed in the flexible substrate by inductively coupled plasma (ICP) etching, so that the etching uniformity of the chamber is good, there is no etching residue, and the process is easy to be realized, thereby effectively solving the disadvantages of the prior method such as low yield and complex process realization.

Of course, implementing any product or method of the present disclosure does not necessarily need to achieve all the advantages described above at the same time. The other features and advantages of the present disclosure will be illustrated in the following description embodiments, and partly become obvious from the description embodiments, or understood by implementing the present disclosure. The objectives and other advantages of the embodiments of the present disclosure can be realized and obtained through the structures specifically pointed out in the specification, claims, and drawings.

The specific implementation manners of the present disclosure will be described in further detail below with reference to the accompanying drawings and embodiments. The following embodiments are used to illustrate the present disclosure, but are not used to limit the scope of the present disclosure. It should be noted that the embodiments in the application and the features in the embodiments can be combined with each other arbitrarily if there is no conflict.

In order to overcome the disadvantages of the prior method such as low yield and complex process realization, and prepare a flexible, transparent and easy-to-integrate piezoelectric transducer, embodiments of the present disclosure provide a flexible acoustic-electric substrate and a preparation method thereof, and a flexible acoustic-electric device.

FIG. 1 is a structural schematic diagram of a flexible acoustic-electric substrate provided by an embodiment of the present disclosure. As shown in FIG. 1, a main body structure of the flexible acoustic-electric substrate provided by embodiments of the present disclosure comprises a flexible substrate 100 and a plurality of piezoelectric components 200 distributed on the flexible substrate 100. A plurality of chambers are provided in the flexible substrate 100, and the plurality of piezoelectric components 200 is in a one-to-one correspondence relationship with the plurality of chambers, thereby forming a plurality of micromechanical structures. The plurality of micromechanical structures form a micromechanical piezoelectric transducer array. For example, the chambers are located on a side of the flexible substrate 100 away from the plurality of piezoelectric components 200, that is, the chambers and the piezoelectric components 200 are respectively located on opposite sides of the flexible substrate 100.

For example, the plurality of piezoelectric components 200 may be arranged regularly or irregularly, and correspondingly, the plurality of chambers may also be arranged regularly or irregularly. For example, an orthographic projection of the piezoelectric component 200 on the flexible substrate 100 and an orthographic projection of the corresponding chamber on the flexible substrate 100 at least partially overlap. For example, in some examples, the orthographic projection of the piezoelectric component 200 on the flexible substrate 100 is bigger than the orthographic projection of the corresponding chamber on the flexible substrate 100, and the orthographic projection of the chamber is located within the orthographic projection of the corresponding piezoelectric component 200.

In a case where the flexible acoustic-electric substrate is used as a flexible sound substrate, an audio signal (electric signal) is loaded to each piezoelectric transducer (that is, the structure formed by the piezoelectric component 200 and the chamber), and the audio signal is converted into sound and emitted through the piezoelectric transducer, thereby realizing the loudspeaker function. In a case where the flexible acoustic-electric substrate is used as a flexible detection substrate, a pulsed electrical signal is provided to each piezoelectric transducer, and a detection parameter is obtained by detecting a voltage signal fed back by each piezoelectric transducer. The flexible acoustic-electric substrate provided by the embodiments of the present disclosure can independently form a sounding panel or a detection panel, and also can be integrated to a surface of a display device or other devices or inside the display device or the other devices. For example, in some examples, the chamber provided in the flexible substrate 100 is formed by etching the flexible substrate 100 using inductively coupled plasma (ICP) etching, and the piezoelectric component 200 provided on a surface of the flexible substrate 100 is formed by deposition and etching.

The embodiments of the present disclosure provide a flexible acoustic-electric substrate in which a chamber is formed by using, for example, an ICP etching, the etching uniformity of the chamber is good, there is no etching residue, and the process is easy to realize, thereby effectively solving the disadvantages of the prior method such as low yield and complex process realization. At the same time, by forming, for example, a transparent piezoelectric transducer array on a flexible substrate, the flexible acoustic-electric substrate has the advantages of simple structure, flexible layout, small size, easy integration, etc., which effectively solves the disadvantages of the prior structure such as large volume, difficult integration, being not capable of bending due to rigidity, and limited application.

The technical solutions of the embodiments of the present disclosure are described in detail below through specific embodiments.

Figure 2:
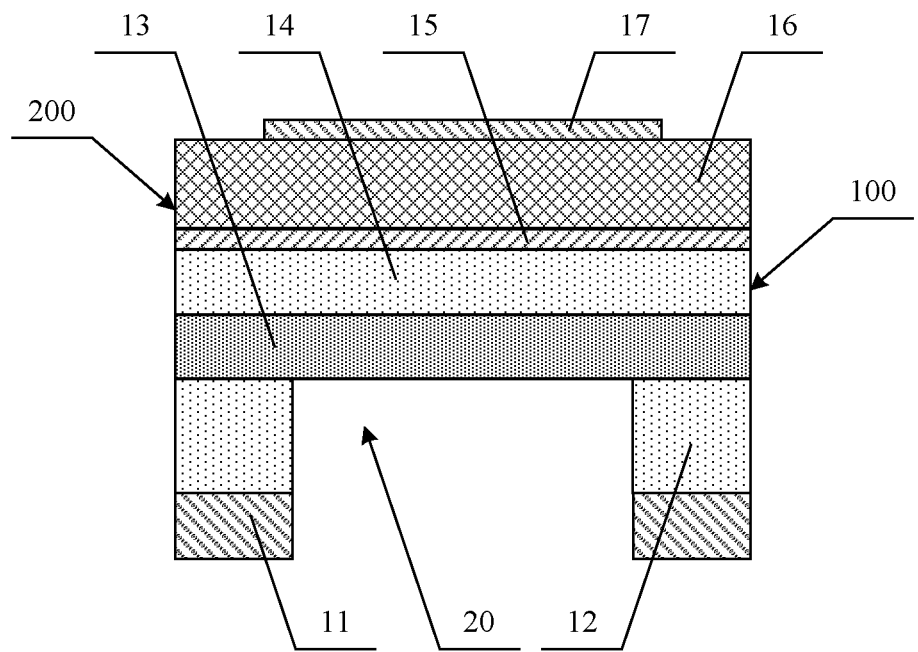
FIG. 2 is a schematic diagram of a cross-section structure of a flexible acoustic-electric substrate provided by embodiments of the present disclosure.

FIG. 2 is a schematic diagram of a cross-section structure of a flexible acoustic-electric substrate provided by embodiments of the present disclosure, and illustrates a cross-sectional view of a piezoelectric transducer (that is, the structure formed by a piezoelectric component 200 and a chamber). As shown in FIG. 2, the main body structure of the piezoelectric transducer of the present embodiment comprises a flexible substrate 100 and a piezoelectric component 200 provided on the flexible substrate 100. A chamber 20 of the piezoelectric transducer is provided in the flexible substrate 100. The piezoelectric component 200 comprises a first electrode 15, a piezoelectric layer 16 and a second electrode 17 stacked on a surface of a side of the flexible substrate 100 away from chamber 20, thereby forming a piezoelectric sandwich structure. The flexible substrate 100 comprises a mask layer 11, a second flexible layer 12, a barrier layer 13 and a third flexible 14, which are sequentially stacked. A space enclosed by the mask layer 11, the second flexible layer 12 and the barrier layer 13 forms the chamber 20, and an opening of the chamber 20 faces away from the piezoelectric component 200. The barrier layer 13 serves as a top wall of the chamber 20, the third flexible layer 14 is provided on a surface of a side of the barrier layer 13 away from chamber 20, and the first electrode 15 of piezoelectric component 200 is provided on a surface of a side of the third flexible layer 14 away from chamber 20. For example, the chamber 20 is formed by etching the flexible substrate 100 using the ICP etching. In the process of ICP etching, the mask layer 11 is used as a hard mask until the barrier layer is reached, and finally the chamber 20 with an opening facing away from the piezoelectric component 200 is formed.

The technical solution of the embodiment will be described in detail below through a preparation process of the flexible acoustic-electric substrate. A "patterning process" mentioned in the embodiment comprises processes of depositing a film layer, coating photoresist, mask exposure, development, etching, and stripping photoresist, etc., and they are all mature preparation processes. The depositing may be performed by using a known process such as sputtering, evaporation, chemical vapor deposition, and the coating may be performed by using a known coating process (such as spin coating or other coating methods), the etching may be performed by using a known method (such as ICP etching or other etching methods), and there is no specific limitation here.

Figure 3:
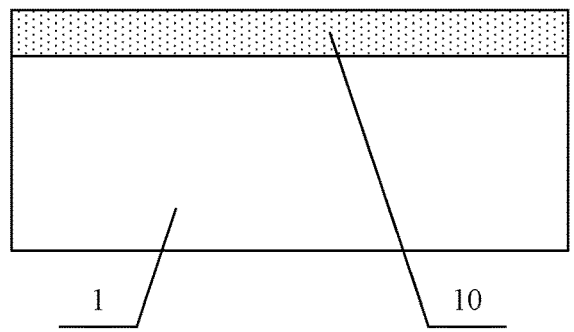
FIG. 3 is a schematic diagram after forming a first flexible layer in a preparation method of a flexible acoustic-electric substrate provided by embodiments of the present disclosure.

(1) A flexible material is coated on a carrier plate (such as a glass carrier plate) 1 and is solidified to form a film, thereby forming a pattern of the first flexible layer 10, as shown in FIG. 3. In the embodiment, the flexible material may be a flexible polymer material such as Polyimide PI, polyethylene terephthalate PET, polydimethylsiloxane PDMS, polycarbonate PC, polyethylene naphthalate PEN, polyethersulfone PES, polyetherimide PEI, polyvinyl alcohol PVA. Coating may be performed by using the spin coating. In the embodiment, for example, the transparent polyimide PI is used as the flexible material.

Figure 4:
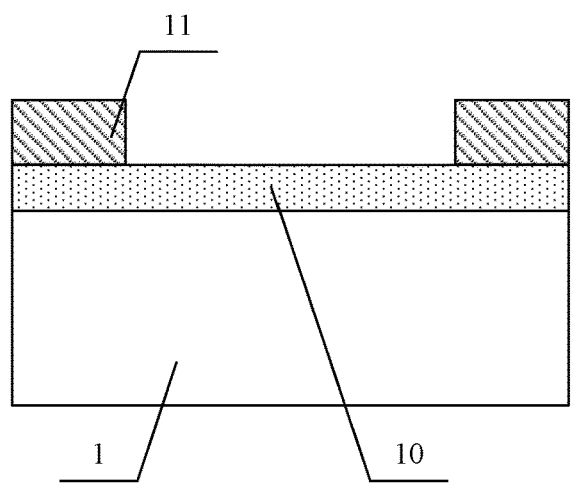
FIG. 4 is a schematic diagram after forming a mask layer in a preparation method of a flexible acoustic-electric substrate provided by embodiments of the present disclosure.

(2) Preparing the pattern of the mask layer. The preparing the pattern of the mask layer comprises: depositing a layer of a first mental film on the first flexible layer 10 and patterning the first mental film by the patterning process, to form a pattern of the mask layer 11, as shown in FIG. 4. In the embodiment, the pattern of the mask layer 11 is used as a hard mask in the sequential process of forming the chamber by ICP etching.

Figure 5:
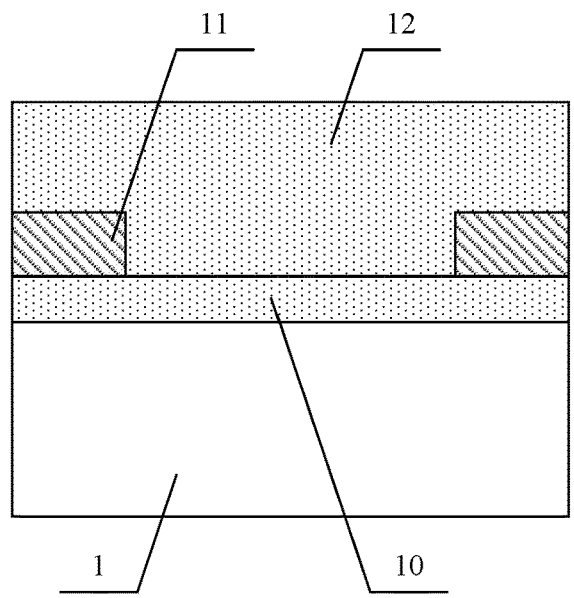
FIG. 5 is a schematic diagram after forming a second flexible layer in a preparation method of a flexible acoustic-electric substrate provided by embodiments of the present disclosure.

(3) Preparing a pattern of the second flexible layer. The preparing the pattern of the second flexible layer comprises: coating a flexible material on the glass carrier plate on which the aforementioned pattern is formed and solidifying the flexible material to form a film, thereby forming a pattern of the second flexible layer 12, as shown in FIG. 5. After the process, the second flexible layer 12 covers the first flexible layer 10 and the pattern of the mask layer 11, and the material of the second flexible layer 12 is the same as the material of the first flexible layer 10.

Figure 6:
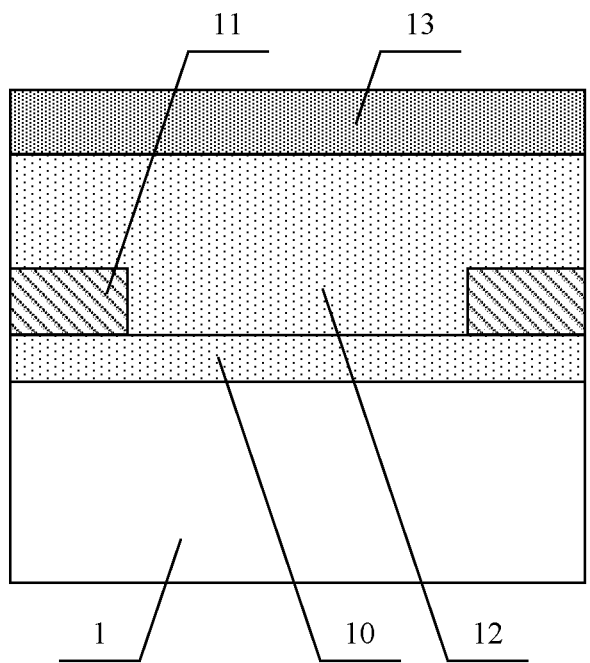
FIG. 6 is a schematic diagram after forming a barrier layer in a preparation method of a flexible acoustic-electric substrate provided by embodiments of the present disclosure.

(4) Preparing a pattern of the barrier layer. The preparing the pattern of the barrier layer comprises: depositing a layer of barrier film on the glass carrier plate on which the aforementioned pattern is formed to form a pattern of barrier layer 13, as shown in FIG. 6. The barrier film may be made of a material such as silicon oxide SiOx or monocrystalline silicon a-Si, and may be a single layer or a multilayer composite structure. In the embodiment, on one hand, the barrier layer 13 serves as a barrier in a subsequent etching process of forming the chamber, so that the barrier layer 13 serves as a top wall of the chamber. On the other hand, because the material such as silicon oxide SiOx or monocrystalline silicon a-Si has the features of a certain rigidity and a large Young's modulus, the barrier layer 13 can play a role in adjusting the resonant frequency of the piezoelectric transducer. In addition, the barrier layer 13 can also improve the planarization and the ability of resistance to water and oxygen of the flexible substrate. In actual implementation, a thickness of the barrier layer 13 may be designed according to the principle of piezoelectric design, and the tuning frequency of the piezoelectric transducer may be adjusted by changing the thickness of the barrier layer 13.

Figure 7:
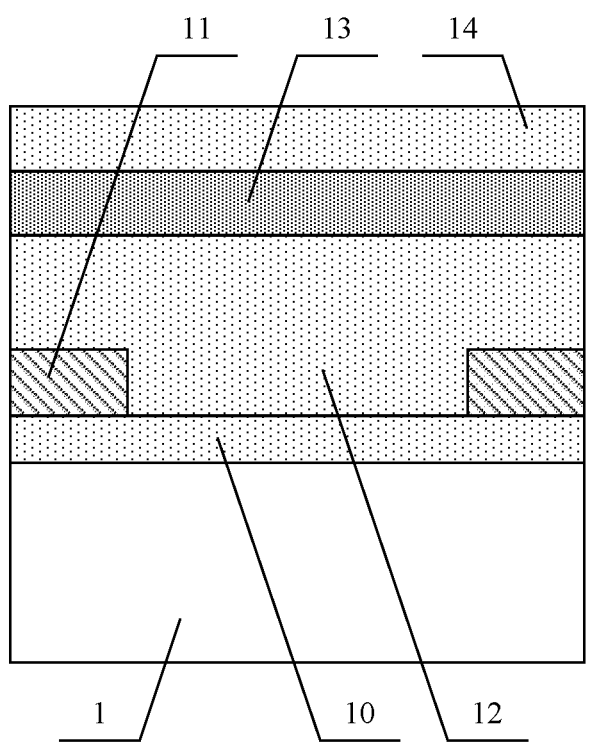
FIG. 7 is a schematic diagram after forming a third flexible layer in a preparation method of a flexible acoustic-electric substrate provided by embodiments of the present disclosure.

(5) Preparing a pattern of the third flexible layer. The preparing the pattern of the third flexible layer comprises: coating the flexible material on the glass carrier plate on which an aforementioned pattern is formed and solidifying the flexible material to form a film, thereby forming a pattern of the third flexible layer 14, as shown in FIG. 7. In the embodiment, the third flexible layer 14 is made of transparent polyimide PI or polyethylene terephthalate PET and other flexible polymer materials, which are the same as the materials of the first flexible layer 10 and the second flexible layer 12.

Figure 8:
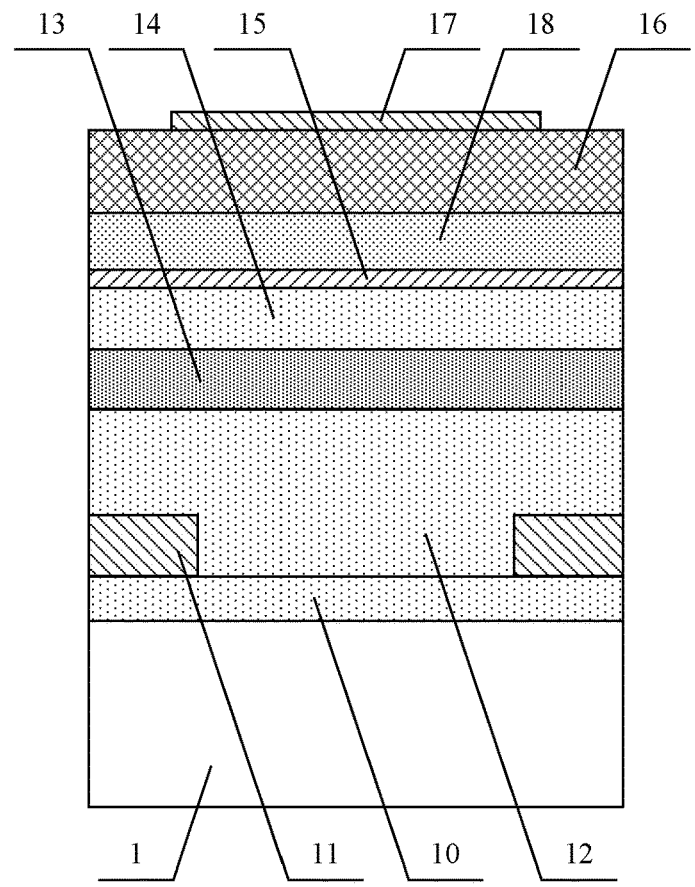
FIG. 8 is a schematic diagram after forming a piezoelectric component in a preparation method of a flexible acoustic-electric substrate provided by embodiments of the present disclosure.

(6) Preparing a pattern of a piezoelectric component. The preparing the pattern of the piezoelectric component comprises: forming patterns of a first electrode 15, a piezoelectric layer 16 and a second electrode 17 on the glass carrier plate on which the aforementioned pattern is formed by using the patterning process, which are sequentially stacked, that is, forming a piezoelectric sandwich structure, as shown in FIG. 8. For example, a forming process may comprise depositing a first conductive film at first, forming the pattern of the first electrode 15 by a patterning process, and forming a pad pattern in a bonding region at the same time; and then depositing a piezoelectric material film, forming the pattern of the piezoelectric layer 16 by the patterning process, and the piezoelectric layer 16 being provided with a through hole; and then depositing a second conductive film, forming the pattern of the second electrode 17 by the patterning process, and connecting the second electrode 17 with the pad of the bonding region through the through hole. For example, A material of the first conductive film and the second conductive film may be a metal, such as molybdenum Mo, aluminum Al, gold Au, titanium Ti, platinum Pt, ruthenium Ru, iridium Ir and their alloys, or a transparent conductive material such as indium tin oxide ITO or indium zinc oxide IZO, and may be a single layer or a multilayer composite structure. A material of the piezoelectric material film may be a piezoelectric ceramic material, such as lead zirconate titanate piezoelectric ceramic composite crystal PZT, zinc oxide ZnO, aluminum nitride AN, etc., or a transparent organic piezoelectric material, such as polyvinylidene fluoride PVDF. In the embodiment, for example, a material of the piezoelectric layer 16 is a transparent polyvinylidene fluoride PVDF.

In the embodiment, in the piezoelectric sandwich structure, an insulating layer 18 is also provided between the first electrode 15 and the piezoelectric layer 16, and a material of the insulating layer 18 may be silicon nitride SiNx or the like for planarization and insulation. In actual implementation, the insulating layer 18 may be an optional film layer, that is, in some other examples, the insulating layer 18 may be omitted.

In the embodiment, on a plane parallel to the glass carrier plate 1, the first electrode 15, the piezoelectric layer 16, and the second electrode 17 may be arranged in a variety of shapes, such as a circle, a square, a pentagon and a hexagon. Considering that the proper size ratio design of the first electrode 15 and the second electrode 17 helps to obtain greater electric-acoustic conversion efficiency, a ratio of an area of the second electrode 17 to an area of the first electrode 15 is set to be 0.7-0.8 in the embodiment. For example, the ratio of the area of the second electrode 17 to the area of the first electrode 15 is set to be 0.75. On a plane perpendicular to the glass carrier plate 1, in the first electrode 15 and the second electrode 17, a design in which one is a planar-shaped electrode and the other is a block-shaped electrode may be adopted, or both use the block-shaped electrode designs. In a case where both are block-shaped electrode designs, a suitable size ratio of the first electrode 15 and the second electrode 17 can be effectively ensured.

For example, in some examples, the first electrode 15 comprises a plurality of block-shaped electrodes separated from each other, the plurality of first electrodes 15 may be arranged regularly or irregularly, and the second electrode 17 is a continuously extending planar-shaped electrode. An orthographic projection of the second electrode 17 on the flexible substrate covers orthographic projections of the plurality of first electrodes 15 on the flexible substrate. For example, in other examples, the first electrode 15 is a continuously extending planar-shaped electrode, the second electrode 17 comprises a plurality of block-shaped electrodes separated from each other, and an orthographic projection of the first electrode 15 on the flexible substrate covers orthographic projections of the plurality of second electrodes 17. For example, in still other examples, the first electrode 15 comprises a plurality of block-shaped electrodes separated from each other, the second electrode 17 also comprises a plurality of block-shaped electrodes separated from each other, the number of the first electrodes 15 and the number of the second electrodes 17 are equal and the first electrodes 15 and the second electrodes 17 are in a one-to-one correspondence relationship, and an orthographic projection of each first electrode 15 on the flexible substrate at least partially overlaps with an orthographic projection of the corresponding second electrode 17 on the flexible substrate.

Figure 9:
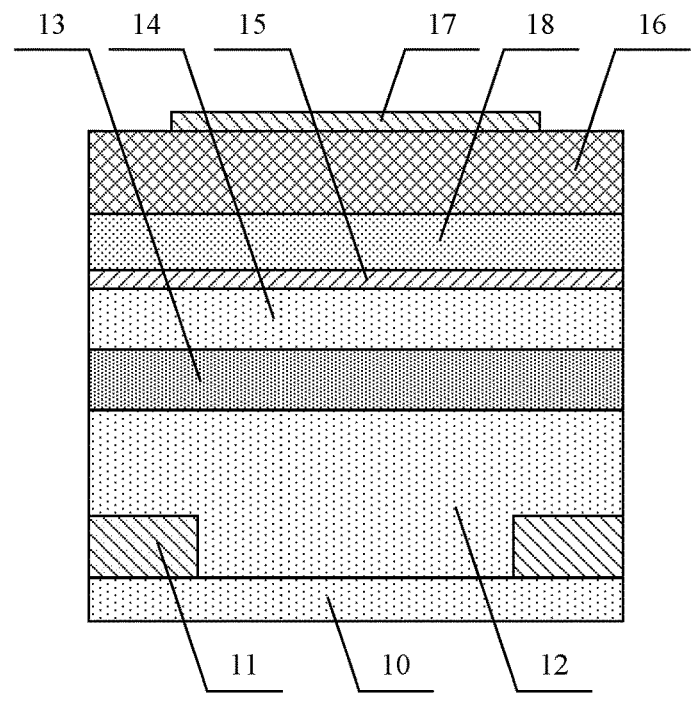
FIG. 9 is a schematic diagram after peeling off a carrier plate in a preparation method of a flexible acoustic-electric substrate provided by embodiments of the present disclosure.

(7) Peeling the glass carrier plate. The peeling the glass carrier plate comprises: separating the glass carrier plate and a film layer formed on the glass carrier plate by using a laser stripping process, as shown in FIG. 9.

Figure 10:
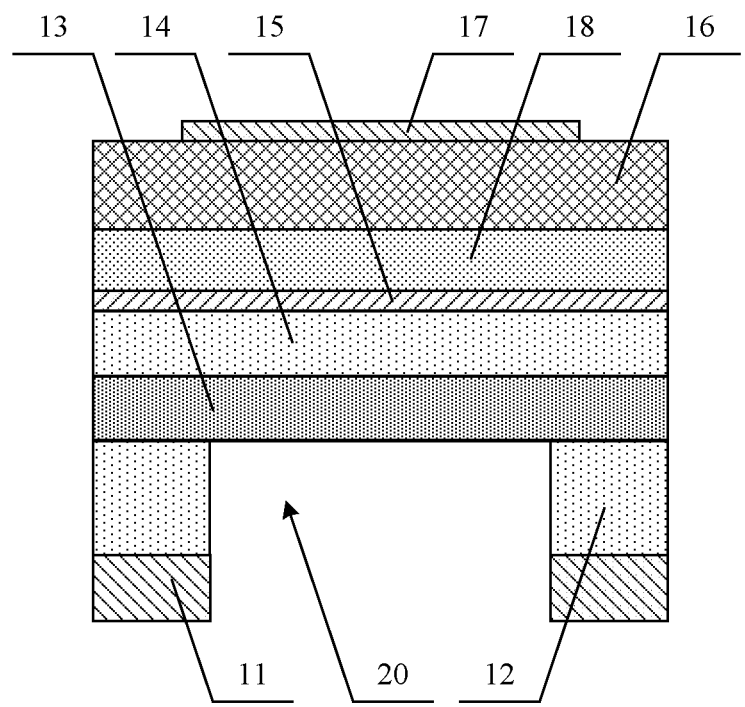
FIG. 10 is a schematic diagram after forming a chamber in a preparation method of a flexible acoustic-electric substrate provided by embodiments of the present disclosure.

(8) Etching a chamber. The etching the chamber comprises: etching the first flexible layer 10 and the second flexible layer 12 by using ICP etching to form a chamber 20, as shown in FIG. 10. In the process of ICP etching, etching the first flexible layer 10 at first, the pattern of the mask layer 11 is exposed after the first flexible layer 10 is etched away, and sequentially etching the second flexible layer 12 using the pattern of the mask layer 11 as a hard mask, so that a portion of the second flexible layer 12 that is blocked by the pattern of the mask layer 11 is retained, and the other portion that is not blocked by the pattern of the mask layer 11 is etched away until the barrier layer 13 is reached, and the chamber 20 is finally formed.

A basic principle of ICP etching is that under vacuum at low pressure, the radio frequency generated by the ICP radio frequency power supply is output to an annular coupling coil, and a mixed etching gas with a certain proportion undergoes a couple glow discharge to generate a high-density plasma. Under the action of RF radio frequency, these plasmas bombard a surface of the flexible layer, and a bombarded flexible layer detaches in the form of gas. Because the ICP etching has the characteristics of anisotropy, high selection ratio for etching of different materials and strong process controllability, only the flexible layer is etched and the other film layers is not etched, to make the other film layers not be affected during the process of forming the chamber 20. In actual implementation, the formed film structure may be reversed first, and then the ICP etching may be performed. After the foregoing process, the flexible acoustic-electric substrate of the embodiment is prepared.

Figure 11:
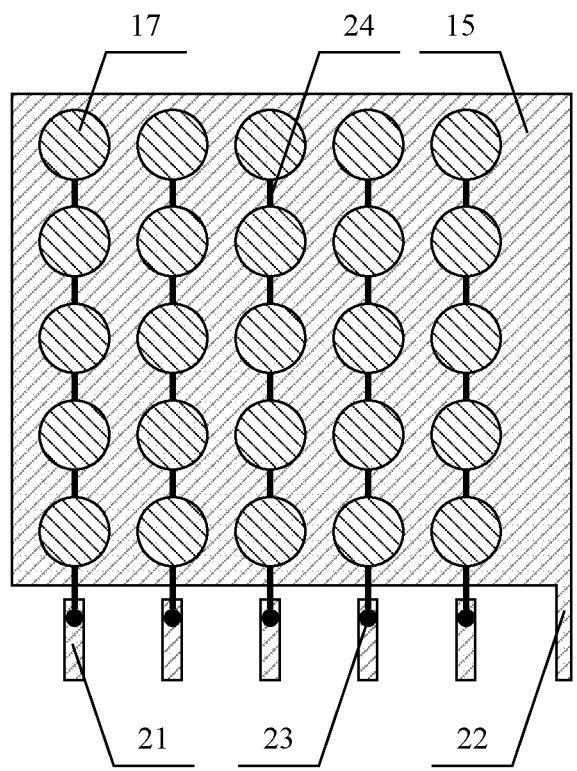
FIG. 11 is a schematic diagram of an electrode structure of a flexible acoustic-electric substrate provided by embodiments of the present disclosure.

FIG. 11 is a schematic diagram of an electrode structure of a flexible acoustic-electric substrate provided by embodiments of the present disclosure. As shown in FIG. 11, in the electrode structure, the first electrode 15 is a planar-shaped electrode, the second electrode 17 is a block-shaped electrode, and a second electrode pad 21 and a first electrode pad 22 are arranged in the same layer as the first electrode 15 and are formed by one patterning process. For example, when the first electrode 15 is formed, the second electrode pad 21 and the first electrode pad 22 are formed in the bonding region simultaneously, the first electrode pad 22 is connected to the first electrode 15, the first electrode pad 22 and the first electrode 15 are an integral structure, and the second electrode pad 21 is separately provided. When the piezoelectric layer 16 is formed on the first electrode 15, a plurality of through holes 23 are formed in the piezoelectric layer 16 at a position where the plurality of the second electrode pads 21 are located in the bonding region, and each through hole 23 exposes each second electrode pad 21. When the block-shaped second electrodes 17 are formed on the piezoelectric layer 16, the second electrodes 17 are sequentially connected in columns (or rows) by an electrode line 24, and the electrode line 24 extends to the bonding region and connects to the corresponding second electrode pad 21 through the corresponding through hole 23.

Figure 12:
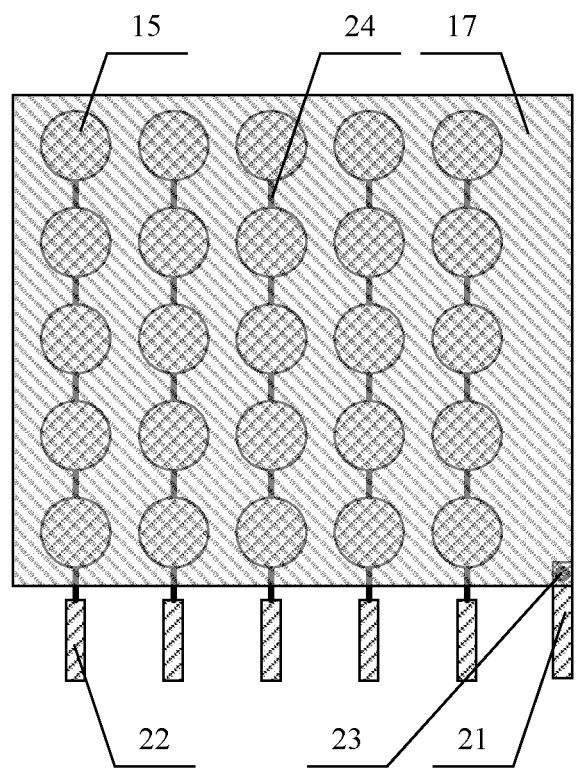
FIG. 12 is a schematic diagram of an electrode structure of another flexible acoustic-electric substrate provided by embodiments of the present disclosure.

FIG. 12 is a schematic diagram of an electrode structure of another flexible acoustic-electric substrate provided by embodiments of the present disclosure. As shown in FIG. 12, in the electrode structure, the first electrode 15 is a block-shaped electrode, the second electrode 17 is a planar-shaped electrode, and the second electrode pad 21 and the first electrode pad 22 are arranged in the same layer as the first electrode 15 and formed by one patterning process. For example, the electrode wire 24 is formed at the same time when the block-shaped first electrode 15 is formed, and the second electrode pad 21 and the first electrode pad 22 are formed in the bonding region. The first electrodes 15 are sequentially connected in columns or rows by the electrode wire 24, and the electrode line 24 extends to the bonding region and is connected to the first electrode pad 22. The first electrode 15, the electrode wire 24 and the first electrode pad 22 are an integral structure, and the second electrode pad 21 is arranged separately. When the piezoelectric layer 16 is formed on the first electrode 15, the through hole 23 is formed in the piezoelectric layer 16 at a position where the second electrode pad 21 is located, and the through hole 23 exposes the second electrode pad 21. When the planar-shaped second electrode 17 is formed on the piezoelectric layer 16, the second electrode 17 is connected to the second electrode pad 21 through the through hole 23. Compared with the electrode structure shown in FIG. 11, the electrode structure only needs to provide one through hole to realize the connection of an entire surface of the second electrode 17 to the second electrode pad 21 in the bonding region, which simplifies the manufacturing process.

Figure 13:
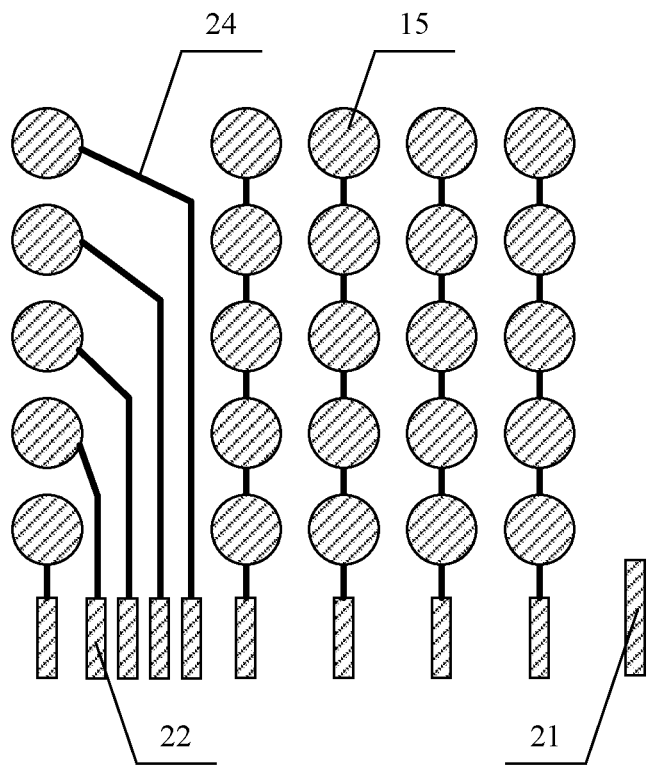
FIG. 13 is a schematic diagram of an electrode structure of still another flexible acoustic-electric substrate provided by embodiments of the present disclosure.

FIG. 13 is a schematic diagram of an electrode structure of a another flexible acoustic-electric substrate provided by embodiments of the present disclosure. The example is an extension of the electrode structure shown in FIG. 12. As shown in FIG. 13, in the electrode structure, the second electrode 17 is a planar-shaped electrode (not shown), which has the same structure as the second electrode 17 of the electrode structure shown in FIG. 12. The first electrode 15 is a block-shaped electrode, but a portion of the first electrodes 15 are independently led out to the bonding region by a separate electrode line 24, that is, in the portion of the first electrodes 15, each first electrode 15 is individually connected to one electrode line 24. The other portion of the first electrodes 15 are led out to the bonding region in columns in a manner of being sequentially connected by the electrode line 24. In actual implementation, a solution in which all the first electrodes 15 are independently led out using separate electrode line 24 may be adopted. Compared with the electrode structure shown in FIG. 12, the electrode structure is easier to achieve differentiated driving through differentiated design, which can improve the overall device performance.

Figure 14:
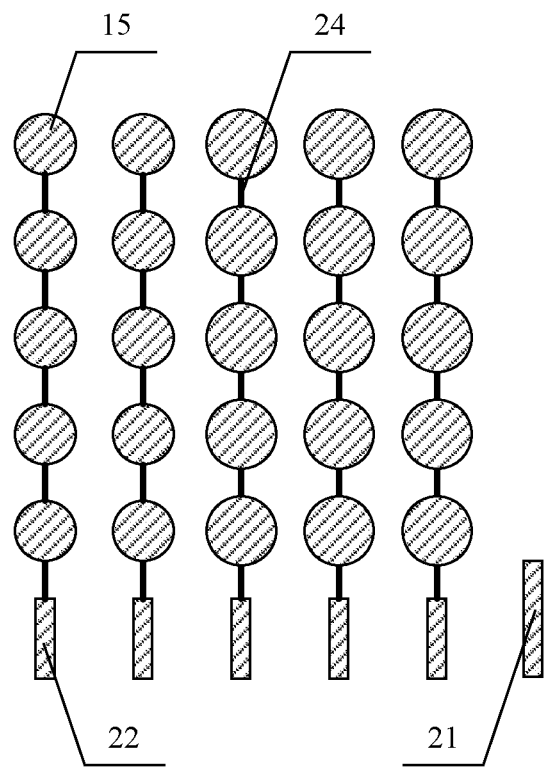
FIG. 14 is a schematic diagram of an electrode structure of still another flexible acoustic-electric substrate provided by embodiments of the present disclosure.

FIG. 14 is a schematic diagram of an electrode structure of a another flexible acoustic-electric substrate provided by embodiments of the present disclosure. The example is another extension of the electrode structure shown in FIG. 12. As shown in FIG. 14, in the electrode structure, the second electrode 17 is a planar-shaped electrode (not shown), which is the same as the second electrode 17 of the electrode structure shown in FIG. 12. The first electrodes 15 are a block-shaped electrode, and are led out to the bonding region in columns in a manner of sequential connection through the electrode line 24. In the example, areas of the first electrodes 15 in different regions are different, and the areas of the first electrodes 15 located in a portion of the region are smaller than the areas of the first electrodes 15 located in other regions, for example, the areas of the first electrodes 15 in two columns on the left are smaller than the areas of the first electrodes 15 in three columns on the right in FIG. 14. In actual implementation, a solution in which the areas of the first electrodes 15 are sequentially increased (or decreased) by column (or by row) may also be adopted. For example, in a case where the areas of a portion of the first electrodes 15 are different from the areas of another portion of the first electrodes 15, at least two of the first electrodes 15 may have the same area, or any two of the first electrodes 15 may have different areas. In actual implementation, the second electrode 17 may also adopt a solution with a different area, which will not be repeated here. Compared with the electrode structure shown in FIG. 12, in the electrode structure, it is easy to realize a differentiated drive through a differentiated design, and the overall device performance can be improved.

It should be noted that, in the embodiment of the present disclosure, in a case where a plurality of first electrodes 15 are connected to one first electrode pad 22 through one electrode line 24 in a sequential connection manner, the plurality of first electrodes 15 are one group. The group of first electrodes 15 may be located in the same column or the same row, or may also be located in any position among multiple columns and multiple rows, which is not limited in the embodiment of the present disclosure. For the second electrode 17, a similar arrangement may be adopted, which will not be repeated here.

The several electrode structure designs provided in the embodiment are only examples, and the foregoing electrode structures may be arbitrarily combined into other structure forms in actual implementation. In a case where the flexible acoustic-electric substrate is used as a flexible sound substrate, the first electrodes 15 (or the second electrodes 17) may be connected together and drawn to realize simultaneous driving. However, considering the limited bandwidth of the frequency response curve of the piezoelectric transducer, there may be the sound effect deviation, such as poor low-frequency characteristic. In order to improve the sound quality and obtain a relatively more uniform acoustic response at low, intermediate and high frequencies, the embodiment proposes a differentiated design of the elements in the piezoelectric transducer array, so that the frequency response of the elements in a portion of the region covers the low frequency region, the frequency response of the elements in another portion of the region covers the intermediate frequency region or high frequency region, and the regions are driven respectively or the regions are driven at the same time to obtain a more uniform acoustic response. At the same time, since the piezoelectric transducer has the highest electric-acoustic conversion efficiency in a case where it works near its own resonance frequency, by changing a ratio of the area of the first electrode to the area of the second electrode, no matter which frequency band sound the piezoelectric transducer emits, a portion of the array elements work near the resonant frequency, so that it can maximize the electric-acoustic conversion efficiency.

In the embodiment, a differentiated design can also be realized by adjusting the size of the array elements. Since the resonant frequency of the device is affected by the area of the array element, under the condition that other parameters remain unchanged, the larger the area of the array element, the smaller the resonant frequency. Therefore, differentiated design can be realized by changing the size of the array elements. For example, a plurality of piezoelectric components regularly arranged on a flexible substrate is divided into a plurality of piezoelectric groups, each piezoelectric group comprises a plurality of piezoelectric components, and the sizes of the piezoelectric components and the chambers in each piezoelectric group are the same, but the sizes of the piezoelectric components and the chambers in different piezoelectric group are different.

In the embodiment, the differentiated design can also be realized by adjusting a thickness of a stack. Since the resonant frequency of the device is also affected by a parameter of a material of the stack and a thickness of the stack, under the condition that other parameters remain unchanged, the greater the thickness of the piezoelectric film, the greater the resonant frequency of the device. Therefore, during making the piezoelectric layer, the piezoelectric layer may be respectively made in different regions, and the piezoelectric layers in different regions have different thicknesses. For example, a plurality of piezoelectric components arranged regularly on the flexible substrate are divided into a plurality of piezoelectric groups, each piezoelectric group comprises a plurality of piezoelectric components, and the thicknesses of the piezoelectric layers in each piezoelectric group are the same, but the thicknesses of the piezoelectric layers in different piezoelectric groups are different. In the practical application, the differentiated design may be achieved by adjusting a thickness of an insulation layer in the piezoelectric component. Of course, the combination of adjusting the size of the array element and adjusting the thickness of the stack can more effectively achieve differentiated design.

In the embodiment, by using the differentiated array element design, corresponding to different audio frequency bands, not only a flat response curve and sound quality are ensured, but also the working efficiency of the device can be improved.

According to the foregoing description, in the embodiment, since the chamber is formed in flexible substrate by using ICP etching and the piezoelectric component is formed on a surface of the flexible substrate, and the flexible substrate also serves as a support for the piezoelectric micromechanical structure, a flexible and transparent acoustic-electric substrate is obtained, which has the advantages of high yield and easy process realization. Compared with the prior art that uses the sacrificial layer process to prepare the chamber, it does not need to form and seal the etching hole and preset the sacrificial layer, so the chamber formed in the embodiment has better etching uniformity, no etching residue, simple process realization, high yield, low production cost, easy to form mass production, which effectively solves the disadvantages of the prior method such as low yield and complex process realization. Compared with the prior art with a hard and opaque structure, the transparent piezoelectric component is formed on the flexible substrate, the structure is simple, the layout is flexible, and it has the advantages of small volume, easy integration, bendable, transparent, etc., so it can effectively solve the disadvantages of the prior structure such as large volume, difficulty in integration, being not capable of bending due to rigidity, and limited application. The flexible acoustic-electric substrate according to the embodiment can form an acoustic-electric panel independently, and also can be integrated on a surface or inside of a display device or other devices. In a case where the flexible acoustic-electric substrate according to the present embodiment is integrated on the display device, the display device does not require to form a hole or structural adjustment, the integrated flexible acoustic-electric substrate hardly increases a thickness thereof, and the flexible acoustic-electric substrate can be applied to display devices of various structural forms and has good compatibility and has elegant appearance. It should be noted that in a case where the flexible acoustic-electric substrate is integrated on the display device, in order not to affect the display effect of the display device, each film layer in the flexible acoustic-electric substrate needs to use a material with strong light permeability (except the mask layer, and the pattern of the mask layer may be designed to be approximately the same as a pattern of a pixel defining layer in the display device).

Further, the flexible acoustic-electric substrate of this embodiment is apt to realize the optimization and differentiated design of the array element. By using the optimization and differentiated design of the array element, corresponding to different audio frequency bands, not only a flat response curve and sound quality are ensured, but also the working efficiency of the device can be improved. Further, since the process of preparing the flexible acoustic-electric substrate in the embodiment may be achieved by using prior mature manufacturing equipment, the prior process needs less improvement, which can be well compatible with the manufacturing process of the display device, not only is apt to be implemented, but also can further improve the production efficiency and yield and decrease the production cost, and has the excellent application prospect.

Figure 15:
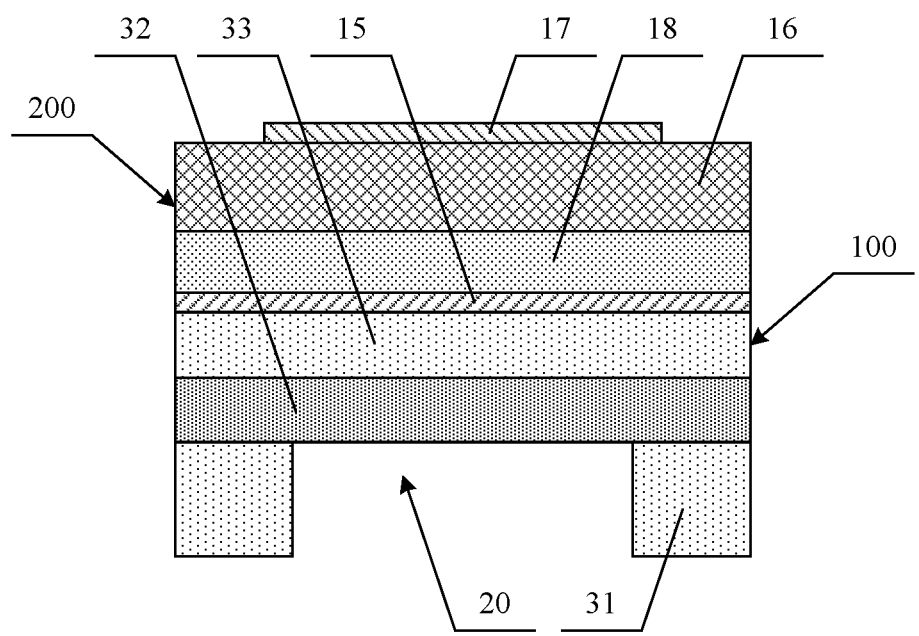
FIG. 15 is a schematic diagram of a cross-section structure of a flexible acoustic-electric substrate provided by embodiments of the present disclosure.

FIG. 15 is a schematic diagram of a cross-section structure of a flexible acoustic-electric substrate provided by an embodiment of the present disclosure, and illustrates a cross-sectional view of one piezoelectric transducer (that is, a structure formed by the piezoelectric component 200 and the chamber). As shown in FIG. 15, a main body of the piezoelectric transducer of the embodiment comprises a flexible substrate 100 and a piezoelectric component 200 provided on the flexible substrate 100, and the chamber 20 of the piezoelectric transducer is provided in the flexible substrate 100. The piezoelectric component 200 comprises a first electrode 15, a piezoelectric layer 16, and a second electrode 17 stacked on a surface of a side of the flexible substrate 100 away from the chamber 20, to form a piezoelectric sandwich structure. The flexible substrate 100 comprises a first flexible film 31, a barrier layer 32, and a second flexible film 33 disposed sequentially. A space enclosed by the first flexible film 31 and the barrier layer 32 forms the chamber 20, and an opening of the chamber 20 faces away from the piezoelectric component 200. The barrier layer 32 serves as a top wall of the chamber 20, the second flexible film 33 is provided on a surface of a side of the barrier layer 32 away from the chamber 20, and the first electrode 15 of the piezoelectric component 200 is provided on a surface of a side of the second flexible film 33 away from the chamber 20. For example, the chamber 20 is formed by using ICP etching, and the chamber 20 with an opening facing away from the piezoelectric component 200 is formed.

The technical solution of the present embodiment will be described in detail below through a preparation process of the flexible acoustic-electric substrate.

Figure 16:
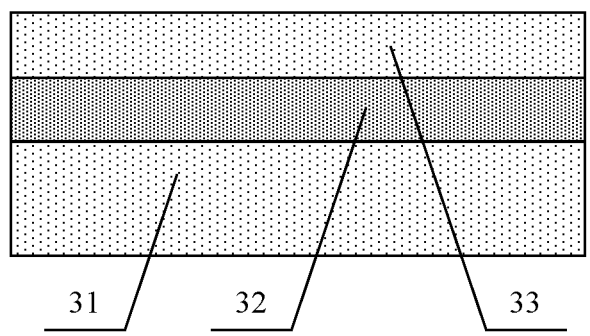
FIG. 16 is a schematic diagram after forming a flexible substrate of a flexible acoustic-electric substrate provided by embodiments of the present disclosure.

(1) Providing a first flexible film 31, a barrier layer 32 and a second flexible film 33 which are ready in advance, all of which are in a sheet form and may be prepared by using other special equipment. Then, the first flexible film 31 and the second flexible film 33 are attached to each other through the barrier layer 32, and the barrier layer 32 is provided between the first flexible film 31 and the second flexible film 33 to form a flexible substrate, as shown in FIG. 16. For example, the barrier layer 32 may be made of a material with a certain rigidity and a large Young's modulus, and bonded to the first flexible film 31 and the second flexible film 33 by coating a surface with a viscous material. On one hand, the barrier layer 32 acts as an etching barrier in the subsequent process of forming the chamber, so that the barrier layer 32 serves as the top wall of the chamber. On the other hand, utilizing the characteristics of the barrier layer 32 having a certain rigidity and a large Young's modulus, the barrier layer 32 can play a role in adjusting the resonance frequency of the piezoelectric transducer. The first flexible film 31 and the second flexible film 33 may be made of transparent polyimide PI.

Figure 17:
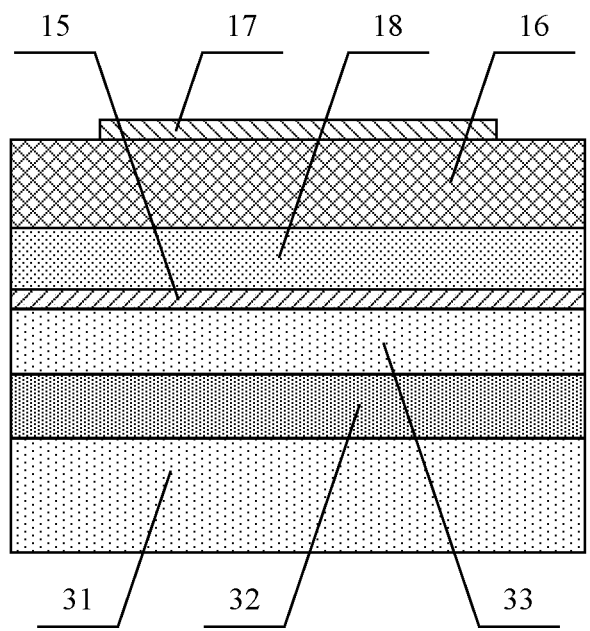
FIG. 17 is a schematic diagram after forming a piezoelectric component of a flexible acoustic-electric substrate provided by embodiments of the present disclosure.

(2) Preparing a pattern of piezoelectric component, as shown in FIG. 17. The process of preparing the pattern of the piezoelectric component in the embodiment is basically the same as that of the previous embodiment, the material and structure form are also basically the same, and will not be repeated here.

(3) Etching the chamber. The etching the chamber comprises: providing a mask on a side of the first flexible film 31, etching the first flexible film 31 by using ICP etching, and forming the chamber 20 on the first flexible film 31, as shown in FIG. 15. In the process of ICP etching, a portion of the first flexible film 31 that is blocked by the mask is retained, and the other portions of the first flexible film 31 that is not blocked by the mask is etched away until the barrier layer 32 that acts as a barrier is reached, and finally the chamber is formed.

In actual implementation, the step (1) may also adopt a method of setting a glass carrier plate. For example, a first flexible film is formed by coating a flexible material on the glass carrier plate and being solidified into a film, a barrier layer is formed by deposition, and a second flexible film is formed by coating a flexible material and being solidified into a film. After the piezoelectric component is prepared, the glass carrier plate is removed, and finally the chamber is formed by the mask and the ICP etching. In the process of forming the chamber, the formed film structure may be turned over at first and then be etched. After the foregoing process, the flexible acoustic-electric substrate of the embodiment is prepared.

In the embodiment, the chamber is formed in the flexible substrate, and, for example, a transparent piezoelectric component is formed on a surface of the flexible substrate, therefore the embodiment also has the beneficial effects of the foregoing embodiments, that is, it has advantages such as high yield, easy process realization, small volume, easy integration, bendable and transparent. Meanwhile, since the first flexible film, the barrier layer and the second flexible film adopt ready-made products, not only the preparation process is simplified, but also the structural parameters such as a thickness of each layer can be ensured.

Figure 18:
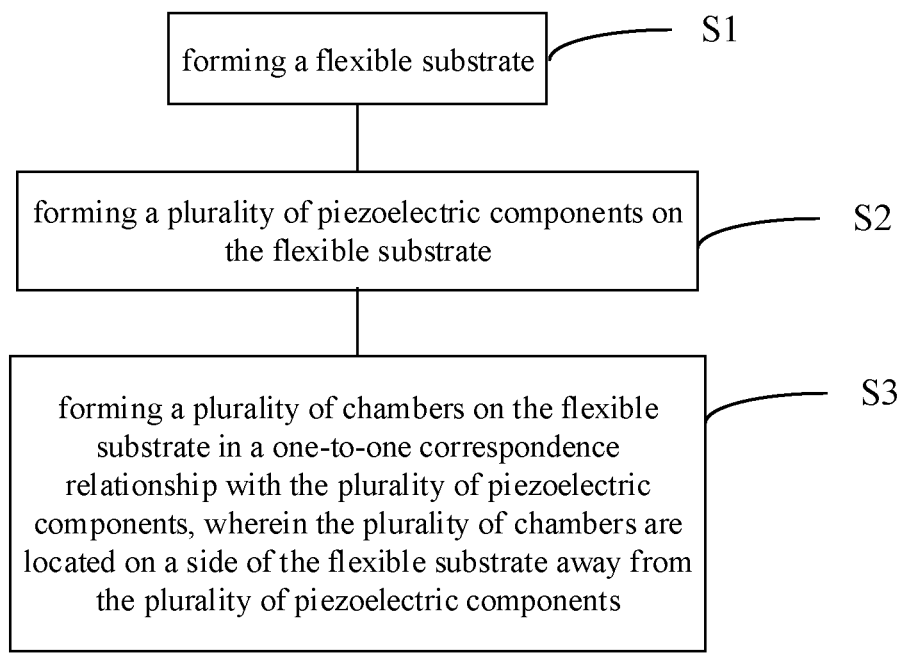
FIG. 18 is a flow schematic diagram of a preparation method of a flexible acoustic-electric substrate provided by embodiments of the present disclosure.

A preparation method of a flexible acoustic-electric substrate is provided by the embodiments of the present disclosure, as shown in FIG. 18. In some embodiments, the preparation method of the flexible acoustic-electric substrate comprises:

step S1: forming a flexible substrate;

step S2: forming a plurality of piezoelectric components on the flexible substrate;

step S3: forming a plurality of chambers on the flexible substrate in a one-to-one correspondence relationship with the plurality of piezoelectric components, and each of the plurality of chambers being located on a side of the flexible substrate away from the plurality of piezoelectric components.

For example, in at least one embodiment, the step S1 comprises:

forming a first flexible layer on a carrier plate;

forming a mask layer on the first flexible layer, and in a process of forming the chamber, the mask layer being used as a hard mask; and forming a second flexible layer, a barrier layer, and a third flexible layer sequentially on the mask layer, to form the flexible substrate.

For example, the flexible substrate comprises the first flexible layer, the mask layer, the second flexible layer, the barrier layer and the third flexible layer.

Correspondingly, the step S3 comprises:

Removing the carrier plate from the flexible substrate; and etching the first flexible layer, and using the mask layer as the hard mask to continue to etch a portion of the second flexible layer that is not blocked by the mask layer until the barrier layer is reached, to form the plurality of chambers in the one-to-one correspondence relationship with the plurality of piezoelectric components.

For example, in another embodiment, the step S1 comprises:

providing a first flexible film, a barrier layer and a second flexible film; and bonding the first flexible film and the second flexible film to each other through the barrier layer, to form the flexible substrate, and the barrier layer is provided between the first flexible film and the second flexible film. The flexible substrate comprises the first flexible film, the barrier layer and the second flexible film.

Correspondingly, the step S3 comprises:

providing a mask on a side of the first flexible film away from the barrier layer; and etching a portion of the first flexible film not blocked by the mask until the barrier layer is reached, to form the plurality of chambers in the one-to-one correspondence relationship with the plurality of piezoelectric components.

For example, in still another embodiment, the step S1 comprises:

forming a first flexible film on a carrier plate by a coating solidification forming film method;

forming a barrier layer on the first flexible film by a depositing method; and forming a second flexible film on the barrier layer by the coating solidification forming film method, to form the flexible substrate.

For example, the flexible substrate comprises the first flexible film, the barrier layer and the second flexible film.

Correspondingly, the step S3 comprises:

removing the carrier plate from the flexible substrate; and providing a mask on a side of the first flexible film away from the barrier layer; and etching a portion of the first flexible film not blocked by the mask until the barrier layer is reached, to form the plurality of chambers in the one-to-one correspondence relationship with the plurality of piezoelectric components.

For example, the etching in each of the foregoing embodiments may use an inductively coupled plasma (ICP) etching process.

For example, a material of the barrier layer comprises silicon oxide SiOx or monocrystalline silicon a-Si, a material of the piezoelectric layer comprises lead zirconate titanate piezoelectric ceramic composite crystal PZT, zinc oxide ZnO or polyvinylidene fluoride PVDF, and a material of the first flexible layer, the second flexible layer, the third flexible layer, the first flexible film, and the second flexible film comprises polyimide PI.

For example, in some embodiments, the step S2 comprises:

forming the plurality of piezoelectric components on the flexible substrate, and each of the plurality of piezoelectric components comprises a first electrode, a piezoelectric layer and a second electrode arranged in sequence; or, forming the plurality of piezoelectric components on the flexible substrate, and each of the plurality of piezoelectric components comprises a first electrode, an insulating layer, a piezoelectric layer and a second electrode arranged in sequence.

For example, in one embodiment, in a case where forming a plurality of piezoelectric components on the flexible substrate, and each of the plurality of piezoelectric components comprises a first electrode, a piezoelectric layer and a second electrode that are arranged in sequence, the preparation method further comprises:

during forming the first electrode on the flexible substrate, forming one or more second electrode pads and first electrode pads respectively in a bonding region of the flexible substrate simultaneously, and the first electrode pad being connected to the first electrode;

during forming the piezoelectric layer on the first electrode, forming a through hole in the piezoelectric layer to expose one or more second electrode pads; and during forming a plurality of block-shaped second electrodes on the piezoelectric layer, forming an electrode line at the same time, wherein the plurality of the second electrodes are connected sequentially by the electrode line in columns or rows, and the electrode line is connected to the corresponding second electrode pad through the through hole; and/or, the plurality of second electrodes are connected to corresponding second electrode pads through separate electrode lines and through holes.

For example, in another embodiment, when a first electrode, a piezoelectric layer and a second electrode are formed sequentially on the flexible substrate, the preparation method further comprises:

when forming a plurality of block-shaped first electrodes on the flexible substrate, forming an electrode line at the same time, and forming one or more second electrode pads and first electrode pads in the bonding region of the flexible substrate, wherein the plurality of the first electrodes are connected sequentially by the electrode line in columns or rows, and the electrode line is connected to the corresponding first electrode pad; and/or, the plurality of first electrodes are connected to corresponding first electrode pads through separate electrode lines;

during forming the piezoelectric layer on the first electrode, forming a through hole on the piezoelectric layer to expose the one or more second electrode pads; and during forming the second electrode on the piezoelectric layer, connecting the second electrode to the second electrode pad through the through hole.

For example, areas of the second electrodes of at least two piezoelectric components are different; or, areas of the first electrodes of at least two piezoelectric components are different; or, ratios of the area of the second electrode to the area of the first electrode of the at least two piezoelectric components are different; or, thicknesses of the piezoelectric layers of the at least two piezoelectric components are different.

For example, in the same piezoelectric component, the ratio of the area of the second electrode to the area of the first electrode is 0.7-0.8.

For example, a plurality of piezoelectric components are arranged regularly. For example, an orthographic projection of each of the plurality of piezoelectric components on the flexible substrate and an orthographic projection of the corresponding chamber on the flexible substrate at least partially overlap. For example, the carrier plate used in the preparation process comprises a glass carrier plate.

The specific content of the preparation method of the flexible acoustic-electric substrate provided by the embodiments of the present disclosure has been described in detail in the aforementioned preparation process of the flexible acoustic-electric substrate, and will not be repeated here.

The preparation method of a flexible acoustic-electric substrate provided by the embodiments of the present disclosure forms a chamber in the flexible substrate by, for example, ICP etching and forms a piezoelectric component on a surface of the flexible substrate, and the flexible substrate also serves as a support for the piezoelectric micromechanical structure at the same time, so that the prepared flexible and transparent acoustic-electric substrate has the advantages of high yield and easy process realization. Compared with the prior art that uses the sacrificial layer process to prepare the chamber, it does not need to form and seal an etching hole and preset the sacrificial layer, so the chamber formed in the embodiment has better etching uniformity, no etching residue, simple process realization, high yield, low production cost, easy to form mass production, and effectively solves the disadvantages of prior method such as low yield and complex process realization. Compared with the prior art with a hard and opaque structure, the transparent piezoelectric component is formed on a flexible substrate, the structure is simple, the layout is flexible, and it has the advantages of small volume, easy integration, bendable, transparent, etc., so it can effectively solve the disadvantages of prior structure such as large volume, difficulty in integration, being not capable of bending due to rigidity, and limited application. The prepared flexible acoustic-electric substrate can form a sound panel or a detection panel independently, and also can be integrated on a surface or inside of a display device or other devices. In a case where the flexible acoustic-electric is integrated on the display device, the display device does not require form a hole or structural adjustment, the integrated flexible acoustic-electric substrate hardly increases a thickness thereof, and the flexible acoustic-electric substrate can be applied to display devices of various structural forms and has good compatibility and has elegant appearance. Further, by using the optimization and differentiated design of the array elements, corresponding to different audio frequency bands, not only a flat response curve and sound quality are ensured, but also the working efficiency of the device can be improved. The preparation method of the flexible acoustic-electric substrate in the embodiment can be achieved by using prior mature manufacturing equipment, the prior process needs less improvement, which can be well compatible with the manufacturing process of the display device, not only is apt to be implemented, but also can further improve the production efficiency and yield and decrease the production cost, and has the excellent application prospect.

The embodiments of the present disclosure also provide a flexible acoustic-electric device, comprising any flexible acoustic-electric substrate of the foregoing embodiments. The flexible acoustic-electric device may be used as an independent device or integrated on a surface or inside of a display device or other devices.

For example, the flexible acoustic-electric device may be a flexible voice device, such as a speaker, or a flexible detection device, such as a fingerprint recognizer and a distance detector.

For detailed description and technical effects of the flexible acoustic-electric device, reference may be made to the above description of the flexible acoustic-electric substrate, which will not be repeated here.

In the description of the embodiments of the present disclosure, it should be understood that the orientation or positional relationship indicated by the terms "middle", "upper", "lower", "front", "rear", "vertical", "horizontal", "top", "bottom", "inside", and "outside", etc. is based on the orientation or positional relationship shown in drawings and is only for convenience of describing the present disclosure and simplifying the description, rather than indicated or implied that the pointed device or element must have a specific orientation, be configured and operate in a specific orientation, and therefore cannot be understood as a limitation of the present disclosure.

In the description of the embodiments of the present disclosure, it should be noted that, unless otherwise clearly specified and limited, the terms "installation", "connection", and "connecting" should be understood in a broad sense, and for example, they can be fixed connections, removable connection or integral connection, can be mechanical connection or electrical connection, may be directly connected or indirectly connected through an intermediate medium, and can be the internal communication between two components. For those of ordinary skill in the art, the specific meanings of the above-mentioned terms in the present disclosure can be understood in specific situations.

Although the embodiments disclosed in the present disclosure are as described above, the content described is only the embodiments used to facilitate the understanding of the present disclosure and is not intended to limit the present disclosure. Anyone skilled in the art to which this disclosure belongs, without departing from the spirit and scope disclosed in this disclosure, can make any modifications and changes in implementation forms and details, but the scope of patent protection of this disclosure shall still be subjects to the scope defined by the appended claims.

The invention claimed is:

1. A preparation method of a flexible acoustic-electric substrate, comprising:
    forming a flexible substrate;
    forming a plurality of piezoelectric components on the flexible substrate; and
    forming a plurality of chambers on the flexible substrate in a one-to-one correspondence relationship with the plurality of piezoelectric components, wherein the plurality of chambers are located on a side of the flexible substrate away from the plurality of piezoelectric components,
    wherein the forming the flexible substrate comprises:
    forming a first flexible layer on a carrier plate;
    forming a mask layer on the first flexible layer, wherein when forming the plurality of chambers, the mask layer is used as a hard mask; and
    forming a second flexible layer, a barrier layer, and a third flexible layer sequentially on the mask layer, to form the flexible substrate, wherein the flexible substrate comprises the first flexible layer, the mask layer, the second flexible layer, the barrier layer and the third flexible layer.

2. The preparation method according to claim 1, wherein the forming the plurality of chambers on the flexible substrate in the one-to-one correspondence relationship with the plurality of piezoelectric components comprises:
    removing the carrier plate from the flexible substrate; and
    etching the first flexible layer, and by using the mask layer as the hard mask, continuing to etch a portion of the second flexible layer not blocked by the mask layer until the barrier layer is reached, to form the plurality of chambers on the flexible substrate in the one-to-one correspondence relationship with the plurality of piezoelectric components.

3. The preparation method according to claim 2, wherein an operation of the etching uses an inductively coupled plasma etching process.

4. The preparation method according to claim 1, wherein a material of the barrier layer comprises silicon oxide or monocrystalline silicon, a material of the first flexible layer, the second flexible layer and the third flexible layer comprises polyimide and a material of the first flexible film and the second flexible film comprises polyimide.

5. The preparation method according to claim 1, wherein the forming the plurality of piezoelectric components on the flexible substrate comprises:
    forming the plurality of piezoelectric components on the flexible substrate, wherein each of the plurality of piezoelectric components comprises a first electrode, a piezoelectric layer and a second electrode arranged in sequence; or, forming the plurality of piezoelectric components on the flexible substrate, and each of the plurality of piezoelectric components comprises a first electrode, an insulating layer, a piezoelectric layer and a second electrode arranged in sequence.

6. The preparation method according to claim 5, further comprising:
    while forming the first electrode on the flexible substrate, forming one or more first electrode pads and one or more second electrode pads respectively in a bonding region of the flexible substrate simultaneously, and one of the one or more first electrode pads being connected to the first electrode;
    while forming the piezoelectric layer on the first electrode, forming a through hole in the piezoelectric layer to expose the one or more second electrode pads;
    while forming a plurality block-shaped second electrodes on the piezoelectric layer, forming an electrode line simultaneously, wherein the plurality of the second electrodes are connected sequentially by the electrode line in a column or a row, and the electrode line is connected to one of the one or more second electrode pads through the through hole; and, each of the plurality of second electrodes is connected to the one of the one or more second electrode pads through an individual electrode line and the through hole.

7. The preparation method according to claim 6, wherein areas of the second electrodes of at least two of the plurality of piezoelectric components are different; or, areas of the first electrodes of at least two of the plurality of piezoelectric components are different; or, ratios of the area of the second electrode to the area of the first electrode of at least two of the plurality of piezoelectric components are different; or, thicknesses of the piezoelectric layers of at least two of the plurality of piezoelectric components are different.

8. The preparation method according to claim 6, wherein in each of the plurality of piezoelectric components, a ratio of an area of the second electrode to an area of the first electrode is 0.7-0.8.

9. The preparation method according to claim 5, further comprising:
    while forming a plurality of block-shaped first electrodes on the flexible substrate, forming an electrode line simultaneously, and forming one or more second electrode pads and one or more first electrode pads in a bonding region of the flexible substrate, wherein the plurality of the first electrodes are connected sequentially by the electrode line in a column or a row, and the electrode line is connected to one of the one or more first electrode pads; and, each of the plurality of first electrodes is connected to the one of the one or more first electrode pads through an individual electrode line;
    while forming the piezoelectric layer on each of the plurality of block-shaped first electrodes, forming a through hole on the piezoelectric layer to expose the one or more second electrode pads; and
    while forming the second electrode on the piezoelectric layer, connecting the second electrode to one of the one or more first electrode pads.

10. The preparation method according to claim 5, wherein a material of the piezoelectric layer comprises lead zirconate titanate piezoelectric ceramic composite crystal, zinc oxide or polyvinylidene fluoride.

11. The preparation method according to claim 5, wherein a shape of the first electrode is a circle, a square, a pentagon or a hexagon; and/or
    a shape of the second electrode is a circle, a square, a pentagon or a hexagon.

12. The preparation method according to claim 1, wherein an orthographic projection of each of the plurality of piezoelectric components on the flexible substrate and an orthographic projection of the corresponding chamber on the flexible substrate at least partially overlap.

13. The preparation method according to claim 1, wherein the carrier plate comprises a glass carrier plate.

* * * * *